US012696762B2

(12) United States Patent
Radüge et al.

(10) Patent No.: US 12,696,762 B2
(45) Date of Patent: Jul. 28, 2026

(54) POWER SEMICONDUCTOR MODULE COMPRISING AT LEAST ONE POWER SEMICONDUCTOR ELEMENT

(71) Applicant: Siemens Aktiengesellschaft, Munich (DE)

(72) Inventors: Christian Radüge, Nuremberg (DE); Claus Florian Wagner, Nuremberg (DE); Michael Woiton, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 754 days.

(21) Appl. No.: 18/010,388

(22) PCT Filed: Apr. 27, 2021

(86) PCT No.: PCT/EP2021/060903
§ 371 (c)(1),
(2) Date: Dec. 14, 2022

(87) PCT Pub. No.: WO2021/254679
PCT Pub. Date: Dec. 23, 2021

(65) Prior Publication Data
US 2023/0352362 A1    Nov. 2, 2023

(30) Foreign Application Priority Data
Jun. 15, 2020    (EP) ..................................... 20179978

(51) Int. Cl.
H10W 40/25        (2026.01)
H10W 90/00        (2026.01)
(Continued)

(52) U.S. Cl.
CPC ......... H10W 40/255 (2026.01); H10W 90/00 (2026.01); H10W 72/073 (2026.01);
(Continued)

(58) Field of Classification Search
CPC ...................................................... H01L 23/36
See application file for complete search history.

(56) References Cited

U.S. PATENT DOCUMENTS 5,705,853 A        1/1998 Faller et al.
2005/0230820 A1    10/2005 Licht
                     (Continued)

FOREIGN PATENT DOCUMENTS

CN        103545298 A    1/2014
CN        107636827 A    1/2018
                     (Continued)

OTHER PUBLICATIONS

PCT International Search Report and Written Opinion of International Searching Authority mailed Jul. 30, 2021 corresponding to PCT International Application No. PCT/EP2021/060903 filed Apr. 27, 2021.

*Primary Examiner* — Yu-Hsi D Sun
(74) *Attorney, Agent, or Firm* — Henry M. Feiereisen LLC

(57) ABSTRACT

A power semiconductor module includes a power semiconductor element. In order to reduce the required installation space of the power semiconductor module and to increase the service of the power semiconductor module, the power semiconductor element is connected in an electrically insulating and thermally conductive manner to a cooling element via a dielectric material layer. The dielectric material layer is laid flat on a surface of the cooling element and force-lockingly connected to the cooling element by a first force acting orthogonal to the surface of the cooling element.

17 Claims, 7 Drawing Sheets

(51) Int. Cl.
| | | |
|---|---|---|
| *H10W 72/00* | (2026.01) | |
| *H10W 72/30* | (2026.01) | |

(52) U.S. Cl.
CPC ................. *H10W 72/07336* (2026.01); *H10W 72/07354* (2026.01); *H10W 72/075* (2026.01); *H10W 72/347* (2026.01); *H10W 72/865* (2026.01); *H10W 72/884* (2026.01); *H10W 90/734* (2026.01); *H10W 90/754* (2026.01)

(56) References Cited

U.S. PATENT DOCUMENTS

| | | | |
|---|---|---|---|
| 2006/0138633 | A1 | 6/2006 | Naruse et al. |
| 2006/0150751 | A1 | 7/2006 | Stolze |
| 2009/0261472 | A1 | 10/2009 | Bayerer |
| 2010/0252922 | A1 | 10/2010 | Bayerer et al. |
| 2018/0040538 | A1 | 2/2018 | Schuderer et al. |
| 2018/0122782 | A1* | 5/2018 | Weidner ............. H01L 23/5389 |

FOREIGN PATENT DOCUMENTS

| | | | |
|---|---|---|---|
| DE | 10 2004 051 039 A1 | 5/2006 | |
| DE | 10 2009 002 191 A1 | 10/2010 | |
| EP | 0 762 496 A2 | 3/1997 | |
| EP | 2 437 294 A2 | 4/2012 | |

* cited by examiner

POWER SEMICONDUCTOR MODULE COMPRISING AT LEAST ONE POWER SEMICONDUCTOR ELEMENT

CROSS-REFERENCES TO RELATED APPLICATIONS

This application is the U.S. National Stage of International Application No. PCT/EP2021/060903, filed Apr. 27, 2021, which designated the United States and has been published as International Publication No. WO 2021/254679 A1 and which claims the priority of European Patent Application, Serial No. 20179978.0, filed Jun. 15, 2020, pursuant to 35 U.S.C. 119(a)-(d).

BACKGROUND OF THE INVENTION

The invention relates to a power semiconductor module comprising at least one power semiconductor element.

The invention also relates to a power converter with at least one such power semiconductor module.

Furthermore, the invention relates to a method for producing such a power semiconductor module.

Power semiconductor modules which have ceramic substrates with metallization on both sides are customarily used in power converters, the ceramic substrates generally being soldered via the metallization onto a metallic heat sink, which is designed, for example, as a base plate. A power converter is to be understood, for example, as a rectifier, an inverter, a converter or a DC converter. The ceramic substrates are subject to strong intrinsic stress due to their structure, with the rigid solder joint to the heat sink providing additional stress, in particular mechanical and/or thermo-mechanical stress. The power semiconductor elements used in the power semiconductor modules, which comprise, for example, a transistor, in particular an IGBT (Insulated Gate Bipolar Transistor), are customarily soldered onto the metallization of the ceramic substrate. Therefore, the overall structure has very different thermal expansion coefficients, as a result of which the alternating thermal stresses occurring during operation cause additional, in particular mechanical and/or thermo-mechanical stress.

In order to compensate for the stress factors, in particular mechanical and/or thermo-mechanical stress factors, the ceramic substrate is made thicker than necessary for the electrical insulation properties, as a result of which a thermal resistance between the power semiconductor elements and the heat sink increases. Consequently, power semiconductors with a larger chip surface are required to meet the application-specific requirements due to the higher thermal resistance. Furthermore, the rigid solder joints age, resulting in premature, in particular thermal, failure. In order to reduce thermal travel and nevertheless achieve the required service life, power semiconductors with an even larger chip surface are required. Thus, with increasing miniaturization of power semiconductor modules of the installation space, the service life and the costs represent a major challenge.

The published unexamined patent application EP 0 762 496 A2 describes a power semiconductor module in which at least one semiconductor chip, which is mounted on a bottom plate, is contacted by a respective contact punch. The position of the contact punches can be individually adjusted in accordance with a distance from the semiconductor chips to a main connection receiving the contact punch. The contact punches are either subjected to pressure by means of a spring or fixed by means of a solder layer.

The published unexamined patent application US 2018/122782 A1 describes a power module having a power unit and a control unit for controlling the power unit. The power unit has a heat sink, at least one power component arranged on the heat sink, and an insulating layer covering the heat sink and the at least one power component. In this case, an underside of the power unit is formed by an underside of the heat sink and an upper side of the power unit is formed by at least one contact surface thermally and/or electrically coupled to the at least one power component and a surface of the insulating layer surrounding the at least one contact surface.

The published unexamined patent application US 2009/261472 A1 describes a power semiconductor module having at least one power semiconductor chip and having a pressure apparatus which exerts a pressure on the upper side of the power semiconductor chip when the power semiconductor module is fastened to a heat sink.

The published unexamined patent application US 2005/230820 A1 describes a power semiconductor arrangement having an electrically insulating and thermally conductive substrate which is provided with a structured metallization on at least one side, a cooling apparatus which is in thermal contact with the other side of the substrate, at least one semiconductor element which is arranged on the substrate and is electrically connected to the structured metallization, a partially electrically insulating film having conductor structures, which is arranged at least on the side of the substrate on which the at least one semiconductor element is placed, and which is laminated onto the substrate with or without the at least one semiconductor element in a cavity-free manner, and a pressing facility which exerts a force on the substrate locally and via the at least one semiconductor element, so that the substrate is pressed against the cooling facility.

The published unexamined patent application US 2006/138633 A1 describes a semiconductor apparatus containing first and second semiconductor chips which are formed with electrodes on the front and rear sides, a first conductor rail on which the first semiconductor chip is mounted in such a way that the rear electrode can be connected thereto, a second conductor rail which is arranged parallel to the first conductor rail, a second conductor rail which is arranged parallel to the first conductor rail, on which the second semiconductor chip is mounted in such a way that the rear electrode is connected thereto, a third conductor rail which is compression-bonded to the front electrode of the first semiconductor chip, a fourth conductor rail which is compression-bonded to the front electrode of the second semiconductor chip, and a connecting section which electrically connects the first conductor rail and the fourth conductor rail.

The published unexamined patent application DE 10 2009 002191 A1 describes a power semiconductor module having a power semiconductor chip which has an electrical contact surface on the upper side, to which a bonding wire is bonded. At least when the power semiconductor module is fastened to a heat sink, a pressing element generates a pressing force which acts on a partial section of a bonding wire section which is formed between two adjacent bonding points of the bonding wire. As a result of the pressing force, the power semiconductor chip and a substrate located thereunder are pressed against the heat sink.

Against this background, it is an object of the present invention to further reduce the required installation space of power semiconductor modules and to increase the service life.

SUMMARY OF THE INVENTION

The object is achieved according to the invention by a power semiconductor module having at least one power semiconductor element, the at least one power semiconductor element being connected in an electrically insulating and thermally conductive manner to a cooling element via a dielectric material layer, the dielectric material layer being laid flat on a surface of the cooling element and connected with a non-positive fit to the cooling element by means of a first force acting orthogonally to the surface of the cooling element, the dielectric material layer being contacted directly on the cooling element, the power semiconductor element having a power semiconductor which has a substance-to-substance bond with a first metallic contacting element on a side facing the dielectric material layer, the power semiconductor element being laid on the dielectric material layer via the first metallic contacting element and being connected to the dielectric material layer with a non-positive fit by the first force, the first metallic contacting element being contacted directly on the dielectric material layer.

Furthermore, the object is achieved according to the invention by a power converter having at least one such power semiconductor module.

Furthermore, the object is achieved according to the invention by a method for producing such a power semiconductor module, the dielectric material layer being contacted in a planar manner with the surface of the cooling element, the power semiconductor element being contacted on the dielectric material layer, and a non-positive connection to the cooling element being produced by means of the first force acting orthogonally to the surface of the cooling element.

The advantages and preferred embodiments listed below with regard to the power semiconductor module can be applied analogously to the power converter and the method.

The invention is based on the consideration of reducing the mechanical and/or thermo-mechanical stress in a power semiconductor module and reducing the required installation space by producing an electrically insulating and thermally conductive connection between a power semiconductor element and a cooling element of the power semiconductor module via a dielectric material layer, the dielectric material layer being connected with a non-positive fit to the surface of the cooling element. The power semiconductor module comprises at least one vertical power semiconductor which can be disconnected, as well as connecting means for contacting of the vertical power semiconductor which can be disconnected. Connecting means are, for example, flat contacting elements which are made of a metallic material and are configured for an electrical and/or mechanical connection to a conductor, for example a bonding wire, or to an insulator, for example a dielectric material layer. The power semiconductor is designed, in particular, as a transistor and/or a diode, the transistor being designed, for example, as an Insulated Gate Bipolar Transistor (IGBT), as a Metal Oxide Semiconductor Field Effect Transistor (MOS-FET) or as a field effect transistor. In particular, the power semiconductor element comprises exactly one transistor and/or exactly one diode so that, for example, a half bridge can be formed from two power semiconductor elements.

The dielectric material layer is made of a ceramic material, for example aluminum nitride or aluminum oxide, or an organic material, for example a polyamide. As a result of the elimination of the rigid connection to the heat sink, no metallization of the dielectric material layer is required, which reduces the costs. For example, a thickness d of the dielectric material layer is from 25 µm to 400 µm, in particular 50 µm to 250 µm. The cooling element is designed, for example, as a heat sink containing aluminum, copper and/or alloys thereof. In this case, the dielectric material layer is laid flat on the surface of the cooling element. The non-positive connection is produced by means of a first force acting orthogonally to the surface of the cooling element, the first force, for example, being transmitted from a housing cover to the power semiconductor element. As a result of the elimination of the rigid connection to the heat sink, the stress in the power semiconductor module, in particular mechanical and/or thermo-mechanical stress, is significantly reduced, which enables a thinner embodiment of the dielectric material layer and leads to a longer service life.

Furthermore, the dielectric material layer is contacted directly on the cooling element. In this context, direct contacting excludes additional connecting means such as adhesives, heat-conducting paste, etc. A lower component height is achieved by means of direct contacting, the stress acting on the dielectric material layer being significantly reduced in the case of direct contacting, in particular in comparison with a rigid solder joint.

In addition, the power semiconductor element has a power semiconductor which has a substance-to-substance bond with a first metallic contacting element on a side facing the dielectric material layer, the power semiconductor element being laid on the dielectric material layer via the first metallic contacting element and connected to the dielectric material layer by the first force with a non-positive fit. The first metallic contacting element is designed, for example, as a copper platelet or molybdenum platelet, which has a thickness of 25 µm to 250 µm. The substance-to-substance bond is produced, for example, by soldering or sintering. By means of such a metallic contacting element, the thermal resistance is reduced by spreading the heat to be dissipated, while the electrical insulation effect remains essentially the same.

Moreover, the first metallic contacting element is directly contacted on the dielectric material layer. In this context, direct contacting also excludes additional connecting means such as adhesives, heat-conducting paste, etc. A lower component height is achieved by means of direct contacting, the stress acting on the dielectric material layer being significantly reduced, in particular in comparison with a rigid solder joint, in the case of direct contacting.

A further embodiment provides that the first force is transmitted to the power semiconductor element via a first conductor rail. Such a conductor rail is also called a busbar and is made, for example, of copper. In particular, the conductor rail is arranged essentially perpendicularly on the power semiconductor element, as a result of which no electric field lines in the power semiconductor element are changed, which has a positive effect on the electrical properties during operation. Such a conductor rail has improved reliability and a longer service life, in particular in comparison with a bond connection. Since both force transmission and electrical connection take place via the conductor rail, no additional component is required, as a result of which installation space and costs are saved.

A further embodiment provides that the dielectric material layer produces an adhesive connection between the power semiconductor element and the surface of the cooling element. Such an adhesive connection can be produced, for example, by means of a dielectric material layer which contains an organic material, for example a polyamide. By means of an adhesive connection in addition to the non-positive connection, improved reliability and a longer service life of the power semiconductor module are achieved.

A further embodiment provides that the power semiconductor module has at least two power semiconductor elements, each of the at least two power semiconductor elements being assigned a dedicated dielectric material layer. For example, a half bridge is formed from two power semiconductor elements, each of the two power semiconductor elements of the half bridge being assigned a dedicated dielectric material layer. In particular, in the case of very thin dielectric material layers which, for example, have a thickness of not more than 400 μm, the intrinsic stress is significantly reduced in the case of separate dielectric material layers.

A further embodiment provides that at least a second metallic contacting element is connected in a planar manner to the power semiconductor on a side of the power semiconductor facing away from the dielectric material layer, the first conductor rail being directly contacted with the second metallic contacting element, the first force acting on the second metallic contacting element via the first conductor rail. The second metallic contacting element is designed, for example, as a copper platelet or molybdenum platelet, which has a thickness of 25 μm to 250 μm and protects the power semiconductor from mechanical damage or destruction by the first conductor rail.

A further embodiment provides that the second metallic contacting element is connected to the power semiconductor by a substance-to-substance bond. Such a substance-to-substance bond is produced, for example, by soldering or sintering. An optimum electrical and thermal connection of the contacting element to the power semiconductor element is achieved by means of the substance-to-substance bond.

A further embodiment provides that the first conductor rail is connected with a non-positive fit to the second metallic contacting element. For example, the first conductor rail is pressed onto the second metallic contacting element via a housing cover and thus a thermally and electrically conductive connection is produced. Such a connection is detachable and easy to manufacture.

A further embodiment provides that a control contact, in particular a gate contact, of the power semiconductor is connected, in particular via a bond connection, to a third metallic contacting element, the third metallic contacting element being connected with a non-positive fit to the cooling element by means of a second force acting orthogonally to the surface of the cooling element. Since such control contacts, such as the gate contact of an IGBT, have a very much smaller area, in particular in comparison with a current-carrying emitter contact or a collector contact, these are produced via a conventional bond connection for reasons of cost and in order to simplify production. The third metallic contacting element is designed in particular as a copper platelet or molybdenum platelet, which has a thickness of 25 μm to 250 μm, and enables, for example, a short bonding wire length.

A further embodiment provides that the second force acts on the third metallic contacting element via a second conductor rail. The conductor rail is made, for example, of copper. In particular, the conductor rail is arranged essentially perpendicularly on the third metallic contacting element, which has a positive effect on the electrical properties during operation. Such a conductor rail has improved reliability and a longer service life, in particular in comparison with a bond connection. Since both force transmission and electrical connection take place via the conductor rail, no additional component is required, as a result of which installation space and costs are saved.

A further embodiment provides that the power semiconductor element is formed by producing a substance-to-substance bond of the power semiconductor to a leadframe, the leadframe comprising the first metallic contacting element and the third metallic contacting element, which is connected to the first metallic contacting element, the power semiconductor element being contacted via the leadframe on the dielectric material layer, a bond connection being produced between the control contact, in particular gate contact, of the power semiconductor and the third metallic contacting element of the leadframe, the first metallic contacting element and the third metallic contacting element each being fixed by means of a force acting orthogonally to the surface of the cooling element and the connection between the first metallic contacting element and the third metallic contacting element of the leadframe being separated. In this case, a leadframe is to be understood as meaning a structured metal platelet, the structuring being produced, for example, by stamping or laser cutting. The leadframe comprises the first metallic contacting element and the third metallic contacting element, which are connected to one another by at least one metallic web, a web width being narrower than a width of the first metallic contacting element and the third metallic contacting element. The at least one web is severed between the first metallic contacting element and the third metallic contacting element, in particular by means of laser or by means of mechanical processing, for example cutting. Since the first metallic contacting element and the third metallic contacting element are each fixed by traction during production before the at least one web is severed, such a production method is both simple and reliable.

BRIEF DESCRIPTION OF THE DRAWING

The invention is described and explained in more detail hereinafter with reference to the exemplary embodiments shown in the figures, in which.

DETAILED DESCRIPTION OF PREFERRED EMBODIMENTS

Figure 1:
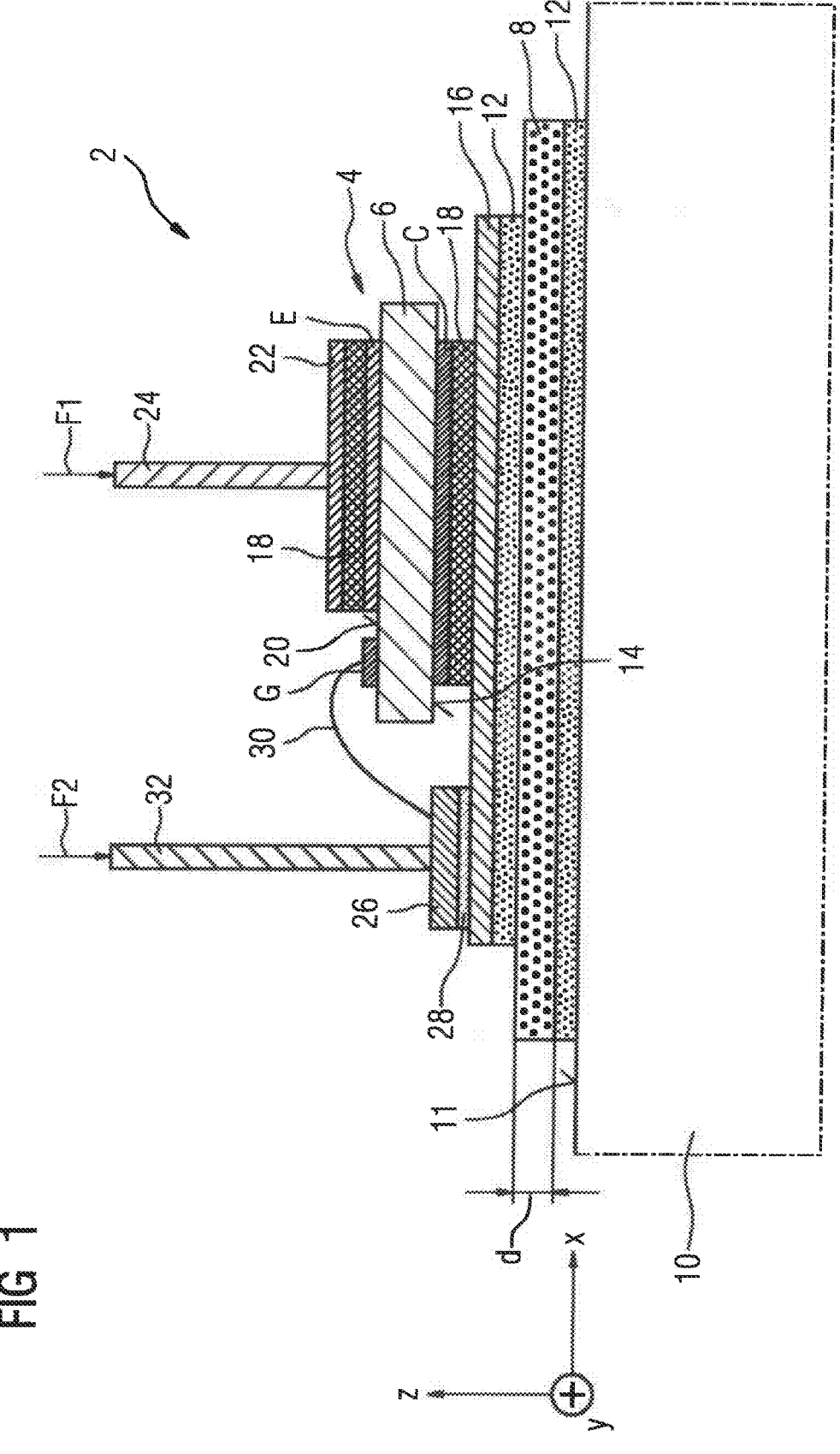
FIG. 1 shows a schematic representation of a first embodiment of a power semiconductor module.

The exemplary embodiments explained hereinafter are preferred embodiments of the invention. In the case of the exemplary embodiments, the described components of the embodiments each represent individual features of the invention to be considered independently of one another, which each also develop the invention independently of one another and are therefore also to be considered individually or in a combination other than the combination shown as part of the invention. Furthermore, the embodiments described can also be supplemented by further features of the invention already described.

Identical reference characters have the same meaning in the various figures.

FIG. 1 shows a schematic representation of a first embodiment of a power semiconductor module 2 comprising a power semiconductor element 4 which has a power semiconductor 6 and a dielectric material layer 8 which is connected in an electrically insulating and thermally conductive manner to a cooling element 10. The cooling element 10 is designed in particular as a heat sink, which is made, for example, of aluminum and/or copper and is suitable for free convection and/or forced air cooling. The dielectric material layer 8 has a ceramic material, for example aluminum nitride or aluminum oxide, or an organic material, for example a polyamide, and is laid flat on a surface 11 of the cooling element 10. For example, a thickness d of the dielectric material layer 8 is 25 μm to 400 μm, in particular 50 μm to 250 μm. Thus, the power semiconductor element 4 is in an electrically insulating and thermally conductive connection with the surface 11 of the cooling element 10 via the dielectric material layer 8. In particular, the dielectric material layer 8 is contacted in a floating manner on the surface 11 of the cooling element 10 by means of a heat-conducting paste 12. The heat-conducting paste 12 is applied as thinly as possible. For example, a heat-conducting paste 12 is used which has very small particles, in particular having a particle size in the range of 0.04 μm to 4 μm. The surface 11 of the cooling element 10 defines an x-y plane and a z-direction.

The power semiconductor 6 is embodied by way of example as an IGBT and has a collector contact C on a side 14 facing the dielectric material layer 8. The collector contact C is connected to a first metallic contacting element 16 by a substance-to-substance bond which is made, for example, of copper. The substance-to-substance bond is produced by means of an electrically and thermally conductive joint compound 18 by, for example, soldering or sintering. The power semiconductor element 4 rests in a floating manner on the dielectric material layer 8 via the first metallic contacting element 16, an electrically insulating and thermally conductive connection existing between the first metallic contacting element 16 and the dielectric material layer 8 as a result of heat-conducting paste 12.

The power semiconductor 6, which is embodied as an IGBT by way of example, has an emitter contact E and a gate contact G on a side 20 facing away from the dielectric material layer 8, a second metallic contacting element 22 which is made, for example, of copper, being connected to the emitter contact E of the power semiconductor 6 by a substance-to-substance bond. The substance-to-substance bond is produced by means of an electrically and thermally conductive joint compound 18, for example by soldering or sintering. A first force F1 is transmitted to the second metallic contacting element 22 via a first conductor rail 24, which is arranged orthogonally to the x-y plane. Via the first force F1, the power semiconductor element 4 is pressed onto the dielectric material layer 8 and the dielectric material layer 8 is pressed onto the surface 11 of the cooling element 10, so that the power semiconductor element 4 is connected to the dielectric material layer 8 with a non-positive fit and the dielectric material layer 8 is connected to the cooling element 10 with a non-positive fit.

A third metallic contacting element 26 is connected, in particular adhesively, via an, in particular adhesively bonded, insulation 28 to the first metallic contacting element 16, the gate contact G of the power semiconductor 4 being contacted with the third metallic contacting element 26 via a bond connection 30. Furthermore, the third metallic contacting element 26 is pressed onto the first metallic contacting element 16 by means of a second force F2 which is acting parallel to the first force F1 and is transmitted via a second conductor rail 32.

Figure 2:
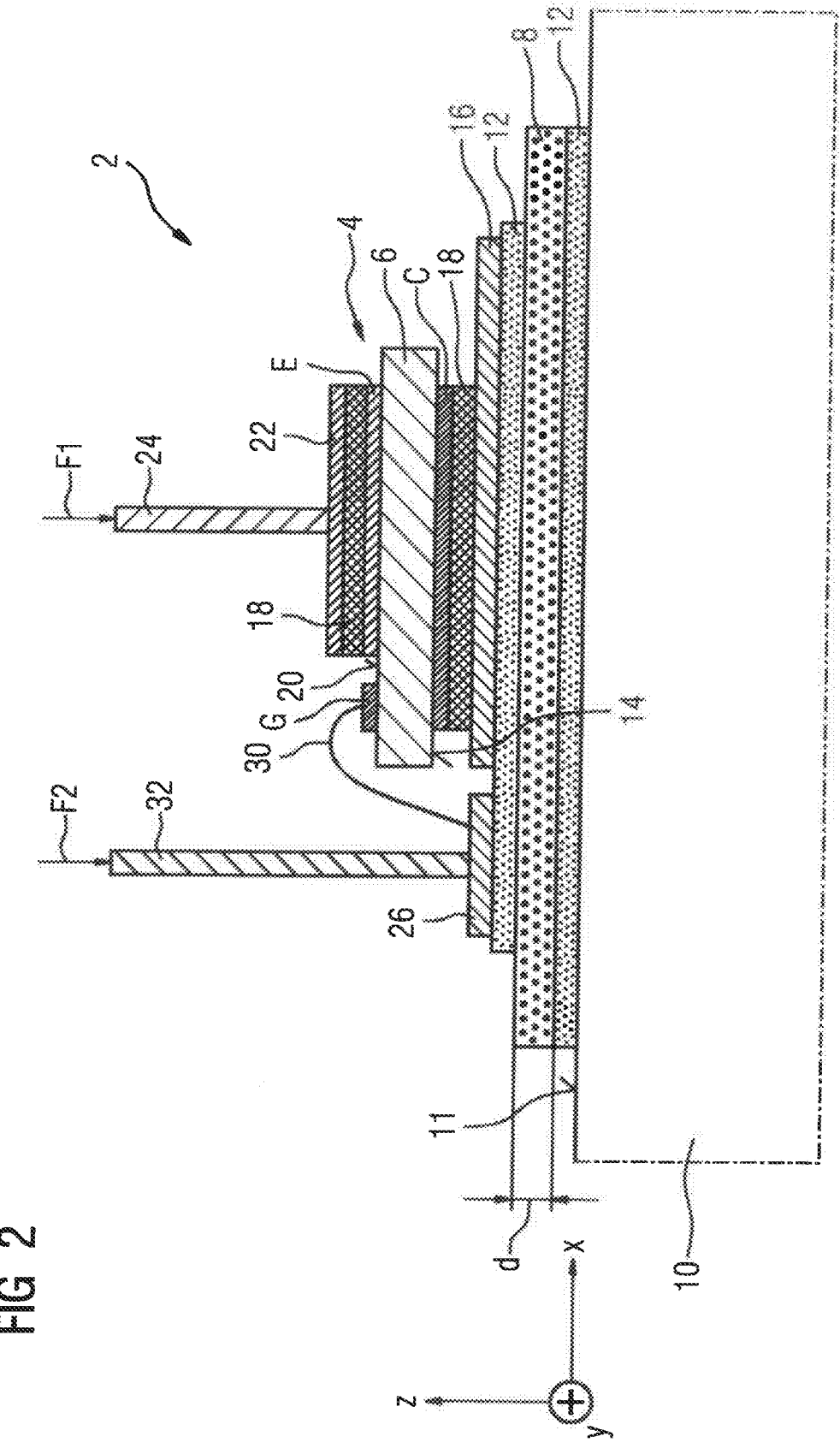
FIG. 2 shows a schematic representation of a second embodiment of a power semiconductor module.

FIG. 2 shows a schematic representation of a second embodiment of a power semiconductor module 2. The third metallic contacting element 26 is pressed with the second force F2 via the second conductor rail 32 onto the dielectric material layer 8, an electrically insulating and thermally conductive connection existing between the third metallic contacting element 26 and the dielectric material layer 8 as a result of heat-conducting paste 12. The further embodiment of the power semiconductor module 2 in FIG. 2 corresponds to the embodiment in FIG. 1.

Figure 3:
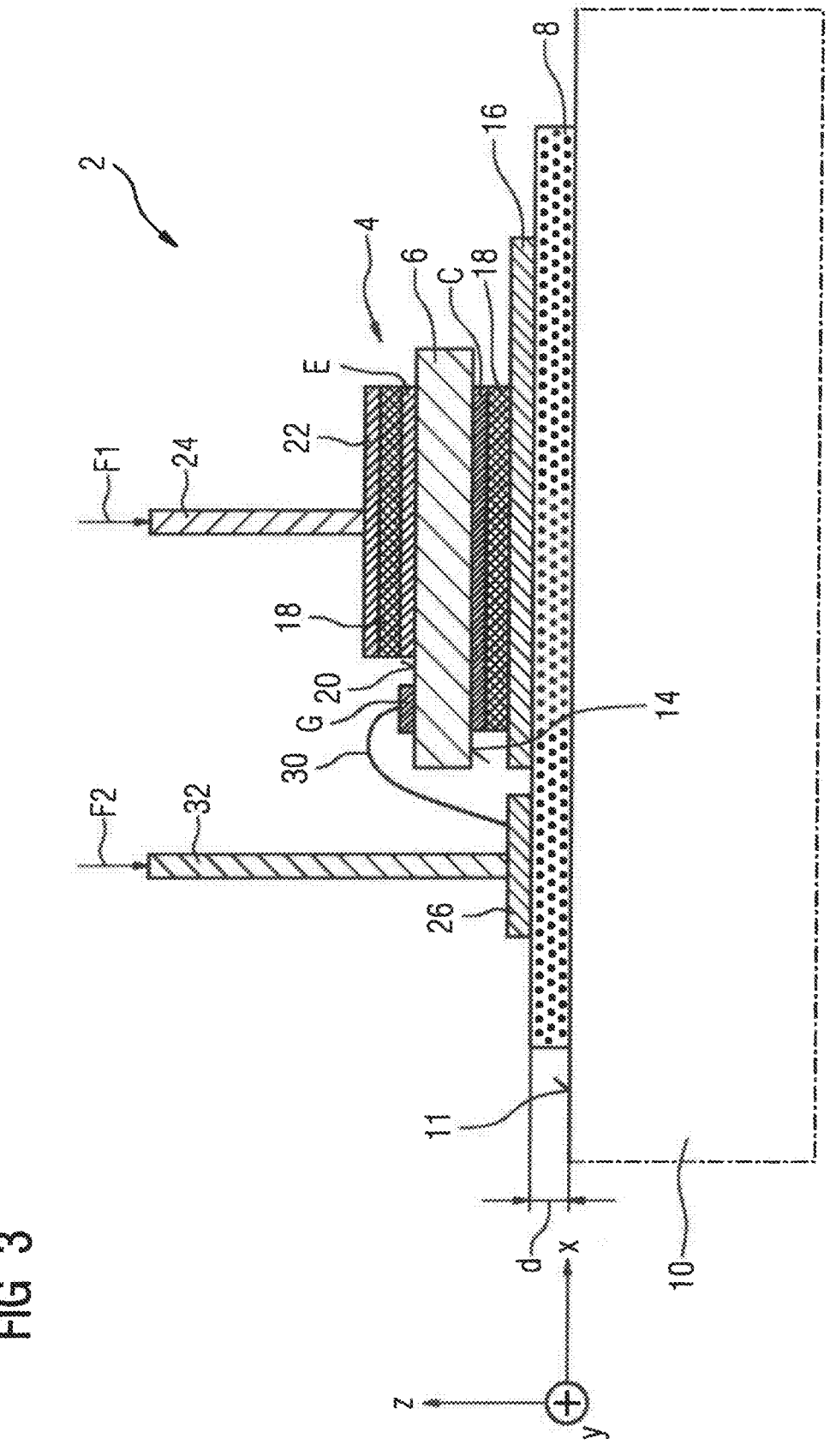
FIG. 3 shows a schematic representation of a third embodiment of a power semiconductor module.

FIG. 3 shows a schematic representation of a third embodiment of a power semiconductor module 2. The dielectric material layer 8 is directly contacted with the surface 11 of the cooling element 10. In this context, direct contacting excludes additional connecting means such as adhesives, solder, heat-conducting paste, etc. Furthermore, the first metallic contacting element 16 of the power semiconductor element 4 is directly contacted with the dielectric material layer 8. The dielectric material layer 8 can be designed as adhesively bonded insulation of an organic material, for example a polyamide. An adhesive connection between the power semiconductor element 4 and the surface 11 of the cooling element 10 can be produced by such a bonded insulation. By pressing by means of conductor rails 24, 32, the power semiconductor element 4 is in an electrically insulating and thermally conductive connection with the surface 11 of the cooling element 10 via the dielectric material layer 8. The further embodiment of the power semiconductor module 2 in FIG. 3 corresponds to the embodiment in FIG. 2.

Figure 4:
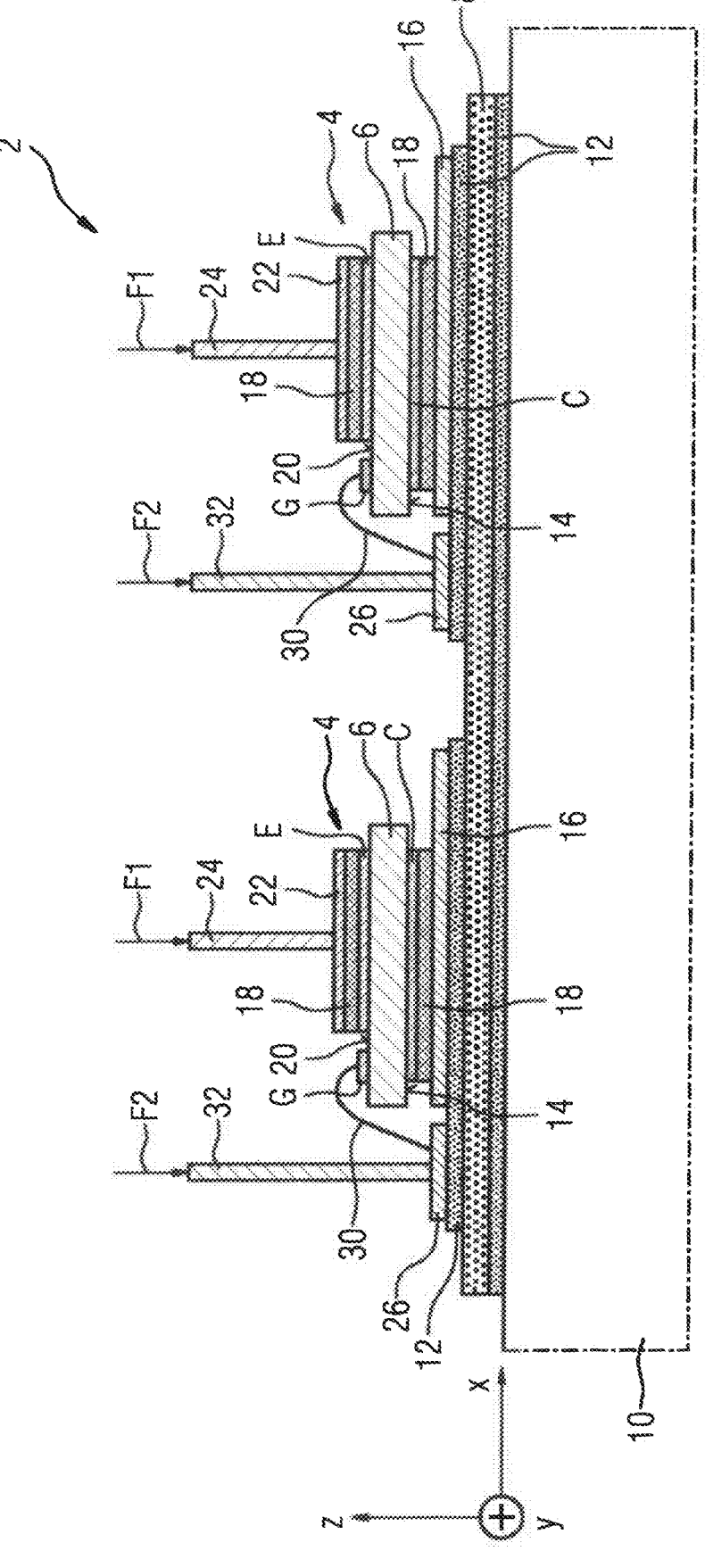
FIG. 4 shows a schematic representation of a fourth embodiment of a power semiconductor module.

FIG. 4 shows a schematic representation of a fourth embodiment of a power semiconductor module 2 which has two power semiconductor elements 4 by way of example. A common dielectric material layer 8 is assigned to the two power semiconductor elements 4. The power semiconductor module 2 can also have more than two power semiconductor elements 4, to which a common dielectric material layer 8 is assigned.

The power semiconductor elements 4 each rest in a floating manner on the common dielectric material layer 8 via a first metallic contacting element 16. An electrically insulating and thermally conductive connection is produced by heat-conducting paste 12 between the respective first metallic contacting element 16 and the common dielectric material layer 8. Furthermore, the common dielectric material layer 8 is contacted in a floating manner on the surface 11 of the cooling element 10 by means of heat-conducting paste 12. By pressing by means of conductor rails 24, 32, the power semiconductor elements 4 are in an electrically insulating and thermally conductive connection with the surface 11 of the cooling element 10 via the common dielectric material layer 8.

The first metallic contacting elements 16 of the respective power semiconductor element 4 can also be directly contacted with the common dielectric material layer 8, and/or the common dielectric material layer 8 can also be directly contacted with the surface 11 of the cooling element 10, an electrically insulating and thermally conductive connection being produced by means of pressing. The further embodiment of the power semiconductor module 2 in FIG. 4 corresponds to the embodiment in FIG. 2.

Figure 5:
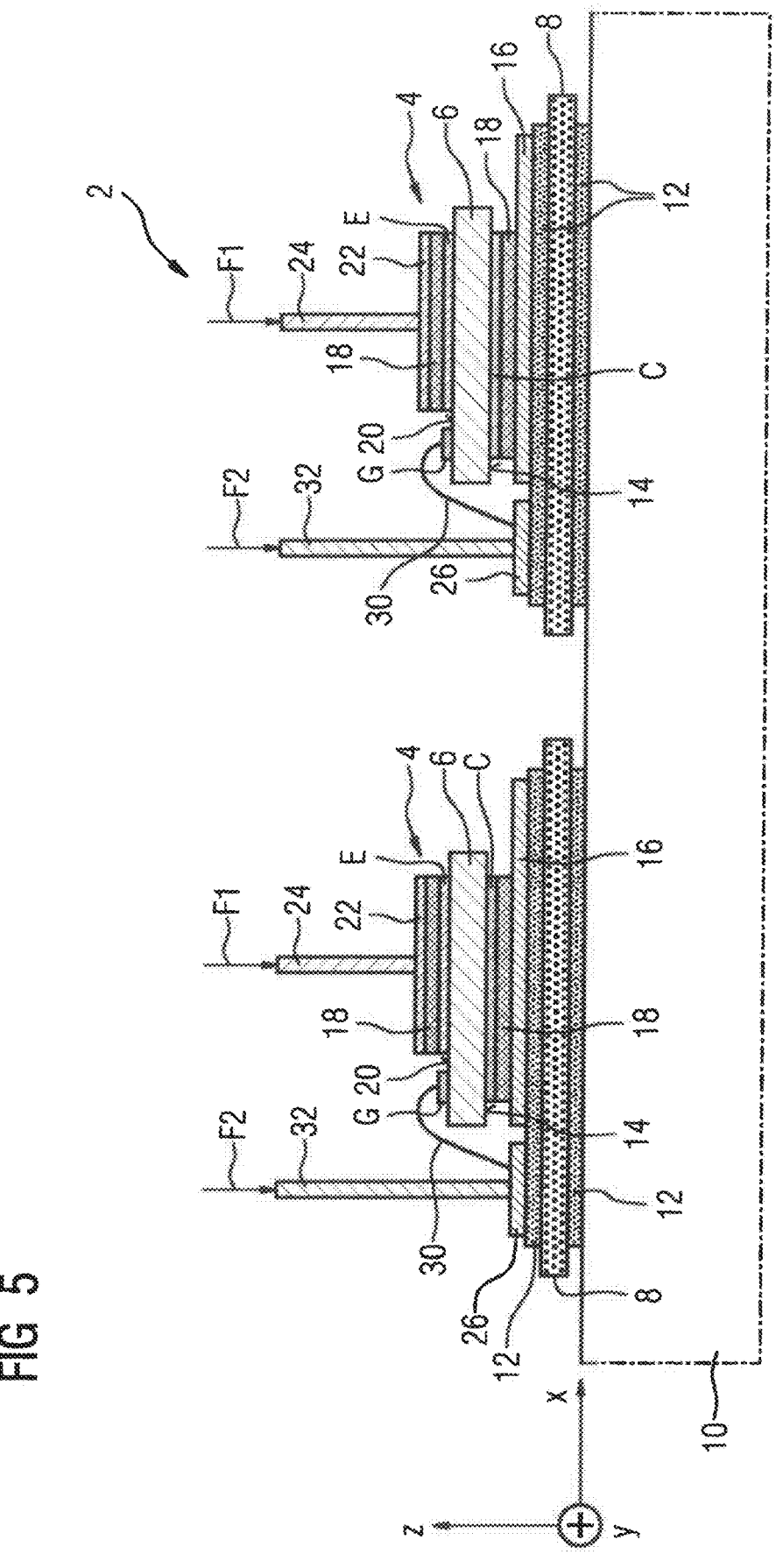
FIG. 5 shows a schematic representation of a fifth embodiment of a power semiconductor module.

FIG. 5 shows a schematic representation of a fifth embodiment of a power semiconductor module 2 which has, by way of example, two power semiconductor elements 4. A dedicated dielectric material layer 8 is assigned to each of the two power semiconductor elements 4. The power semiconductor module 2 can also have more than two power semiconductor elements 4, each of which is assigned a dedicated dielectric material layer 8. The further embodiment of the power semiconductor module 2 in FIG. 5 corresponds to the embodiment in FIG. 4.

Figure 6:
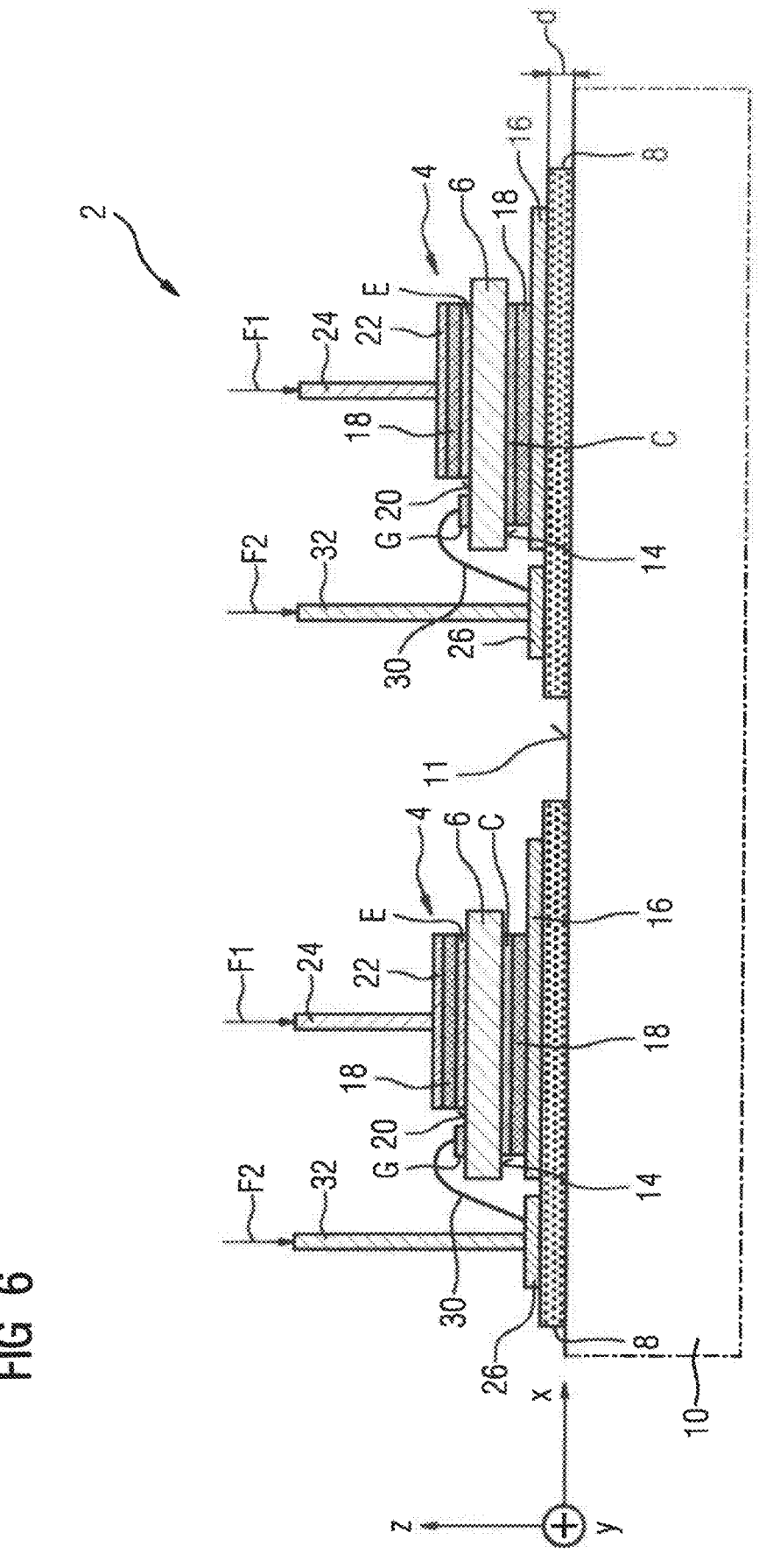
FIG. 6 shows a schematic representation of a sixth embodiment of a power semiconductor module and FIG. 7 shows a schematic representation of a method for producing a power semiconductor module.

FIG. 6 shows a schematic representation of a sixth embodiment of a power semiconductor module 2 which has, by way of example, two power semiconductor elements 4. A dedicated dielectric material layer 8 is assigned to each of the two power semiconductor elements 4, the first metallic contacting elements 16 of the respective power semiconductor element 4 being directly contacted with the dedicated dielectric material layer 8. Furthermore, the dielectric material layers 8 are in each case directly contacted with the surface 11 of the cooling element 10. The further embodiment of the power semiconductor module 2 in FIG. 6 corresponds to the embodiment in FIG. 3.

Figure 7:
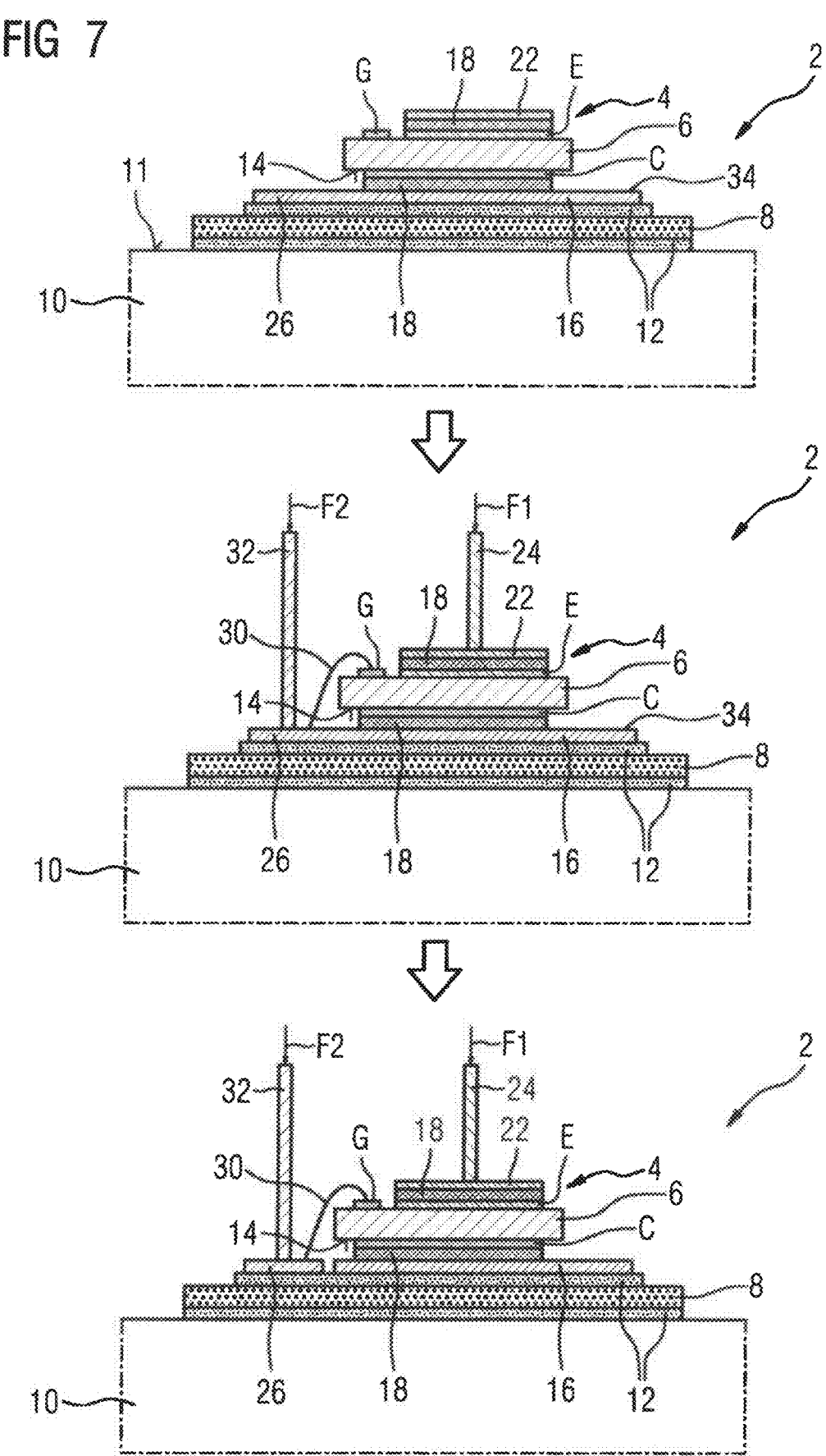

FIG. 7 shows a schematic representation of a method for producing such a power semiconductor module 2. The dielectric material layer 8 is contacted in a planar manner with the surface 11 of the cooling element 10. Furthermore, in order to form the power semiconductor element 4, the collector contact C of the power semiconductor 6, which is embodied as an IGBT by way of example, is connected to a leadframe 34 by a substance-to-substance bond, the leadframe 34 comprising the first metallic contacting element 16 and the third metallic contacting element 26, which is connected to the first metallic contacting element 16. Furthermore, the second metallic contacting element 22 is connected to the emitter contact E of the power semiconductor 6 by a substance-to-substance bond and the power semiconductor element 4 is contacted via the leadframe 34 on the dielectric material layer 8.

In a subsequent step, a bond connection 30 is produced between the gate contact G of the power semiconductor 6 and the third metallic contacting element 26 of the leadframe 34. The first metallic contacting element 16 and the third metallic contacting element 26 are each fixed by means of a force F1, F2 acting orthogonally to the surface 11 of the cooling element 10.

In a subsequent step, the connection between the first metallic contacting element 16 and the third metallic contacting element 26 of the leadframe 34 is separated. The separation of the connection takes place, for example, by means of a laser or by mechanical processing. The further embodiment of the power semiconductor module 2 in FIG. 7 corresponds, by way of example, to the embodiment in FIG. 2. The production of the other embodiments takes place analogously.

In summary, the invention relates to a power semiconductor module 2 comprising at least one power semiconductor element 4. In order to reduce the required installation space of the power semiconductor module 2 and to increase the service life thereof, it is proposed that at least one power semiconductor element 4 is connected via a dielectric material layer 8 to a cooling element 10 in an electrically insulating and thermally conductive manner, the dielectric material layer 8 being laid flat on a surface 11 of the cooling element 10 and being connected to the cooling element 10 with a non-positive fit by means of a first force F1 acting orthogonally to the surface 11 of the cooling element 10.

The invention claimed is:

1. A power semiconductor module, comprising:
a cooling element;
a power semiconductor element including a power semiconductor;
a dielectric material layer which is laid flat on a surface of the cooling element and directly contacted on the cooling element and via which the power semiconductor element is connected in an electrically insulating and thermally conductive manner to the cooling element, said dielectric material layer connected with a non-positive fit to the cooling element by a first force acting orthogonally to the surface of the cooling element; with the power semiconductor element connected with a non-positive fit to the dielectric material layer by the first force;
a first metallic contacting element which is directly contacted on the dielectric layer and via which the power semiconductor element is laid on the dielectric material layer, with the power semiconductor materially connected to the first metallic contacting element on a side facing the dielectric material layer, and
a further power semiconductor element and a dedicated further dielectric material layer assigned to the further power semiconductor element.

2. The power semiconductor module of claim 1, further comprising a first conductor rail configured to transmit the first force to the power semiconductor element.

3. The power semiconductor module of claim 2, further comprising a second metallic contacting element connected in a planar manner to the power semiconductor on a side of the power semiconductor facing away from the dielectric material layer, said first conductor rail directly contacted to the second metallic contacting element, with the first force acting on the second metallic contacting element via the first conductor rail.

4. The power semiconductor module of claim 3, wherein the second metallic contacting element is materially connected to the power semiconductor.

5. The power semiconductor module of the claim 3, wherein the first conductor rail is connected with a non-positive fit to the second metallic contacting element.

6. The power semiconductor module of claim 1,
wherein the dielectric material layer is configured to produce an adhesive connection between the power semiconductor element and the surface of the cooling element.

7. A power semiconductor module, comprising:
a cooling element;
a power semiconductor element including a power semiconductor;
a dielectric material layer disposed flat on a surface of the cooling element and directly contacting the cooling element and connecting the power semiconductor element in an electrically insulating and thermally conductive manner to the cooling element, said dielectric material layer connected with a non-positive fit to the cooling element by a first force acting orthogonally to the surface of the cooling element: with the power semiconductor element connected with a non-positive fit to the dielectric material layer by the first force;
a first metallic contacting element disposed directly on the dielectric layer and connecting the power semiconductor element to the dielectric material layer with the power semiconductor materially connected to the first metallic contacting element on a side facing the dielectric material layer, and a third metallic contacting element connected with a non-positive fit to the cooling element by a second force acting orthogonally to the surface of the cooling element, said power semiconductor including a control contact which is connected to the third metallic contacting element.

8. The power semiconductor module of claim 7, wherein the control contact of the power conductor is a gate contact.

9. The power semiconductor module of claim 7, wherein the control contact of the power semiconductor is connected to the third metallic contacting element by a bond connection.

10. The power semiconductor module of claim 7, further comprising a second conductor rail; with the second force acting on the third metallic contacting element via the second conductor rail.

11. A method for producing a power semiconductor module, comprising:

contacting a dielectric material layer in a planar manner with a surface of a cooling element;

connecting the power semiconductor to a leadframe to form the power semiconductor element through a substance-to-substance bond, with the leadframe comprising a first metallic contacting element and a further metallic contacting element which is connected to the first metallic contacting element; and with the power semiconductor element contacted on the dielectric material layer via the leadframe;

producing a bond connection between a control contact of the power semiconductor and the further metallic contacting element of the leadframe;

applying a first force acting orthogonally to the surface of the cooling element to produce a non-positive connection of the dielectric material layer to the cooling element;

fixing each of the first metallic contacting element and the further metallic contacting element by a second force acting orthogonally to the surface of the cooling element; and separating a connection between the first metallic contacting element and the further metallic contacting element of the leadframe.

12. The method of claim 11, wherein the control contact is a gate contact.

13. The method of claim 11, further comprising:

connecting a second metallic contacting element in a planar manner to the power semiconductor on a side of the power semiconductor facing away from the dielectric material layer;

directly contacting a first conductor rail to the second metallic contacting element such that the first force acts on the second metallic contacting element via the first conductor rail.

14. The method of claim 13, further comprising cohesively materially connecting the second metallic contacting element to the power semiconductor.

15. The method of claim 13, further comprising: connecting the first conductor rail with a non-positive fit to the second metallic contacting element.

16. The method of claim 11, further comprising:

connecting a control contact of the power semiconductor to the further metallic contacting element; and connecting the further metallic contacting element with a non-positive fit to the cooling element by the second force.

17. The method of claim 11, further comprising connecting the control contact of the power semiconductor to the further metallic contacting element by a bond connection.

* * * * *